United States Patent [19]
Sato et al.

[11] Patent Number: 5,238,857
[45] Date of Patent: Aug. 24, 1993

[54] METHOD OF FABRICATING A METAL-OXIDE-SEMICONDUCTOR DEVICE HAVING A SEMICONDUCTOR ON INSULATOR (SOI) STRUCTURE

[75] Inventors: Noriaki Sato, Machida; Kazunori Imaoka, Komae, both of Japan

[73] Assignee: Fujitsu Limited, Kanagawa, Japan

[21] Appl. No.: 893,067

[22] Filed: Jun. 3, 1992

Related U.S. Application Data

[60] Division of Ser. No. 781,651, Oct. 25, 1991, abandoned, which is a continuation of Ser. No. 525,015, May 18, 1990, abandoned.

[30] Foreign Application Priority Data

May 20, 1989 [JP] Japan .................... 1-127501

[51] Int. Cl.$^5$ .................. H01L 21/336; H01L 27/12; H01L 29/78
[52] U.S. Cl. ...................... 437/21; 437/44; 437/162
[58] Field of Search ............ 437/21, 41, 44, 45, 437/162; 148/DIG. 150

[56] References Cited

U.S. PATENT DOCUMENTS

| | | |
|---|---|---|
| 4,106,045 | 8/1978 | Nishi . |
| 4,381,953 | 5/1983 | Ho et al. ............... 437/162 |
| 4,419,810 | 12/1983 | Riseman ............... 437/162 |
| 4,471,522 | 9/1984 | Jambotkar ............. 437/162 |
| 4,675,981 | 6/1987 | Naruke . |
| 4,735,916 | 4/1988 | Homma et al. ......... 437/162 |
| 4,766,482 | 8/1988 | Smeltzer et al. ....... 437/21 |
| 4,864,377 | 9/1989 | Widdershoven . |
| 5,034,335 | 7/1991 | Widdershoven ........ 437/21 |
| 5,064,774 | 11/1991 | Pfiester ................ 437/162 |
| 5,073,512 | 12/1991 | Yoshino ................ 437/41 |
| 5,141,880 | 8/1992 | Inoue et al. ........... 437/21 |
| 5,141,891 | 8/1992 | Arima et al. ........... 437/41 |
| 5,171,698 | 12/1992 | Shimoda ................ 437/162 |
| 5,185,535 | 2/1993 | Farb et al. ............. 437/21 |

FOREIGN PATENT DOCUMENTS

| | | |
|---|---|---|
| 2641302 | 3/1978 | Fed. Rep. of Germany . |
| 55-140270 | 11/1980 | Japan . |
| 56-6152 | 2/1981 | Japan .............. 437/21 |
| 56-137674 | 10/1981 | Japan .............. 437/21 |
| 58-s64064 | 4/1983 | Japan . |
| 58-123764 | 7/1983 | Japan .............. 437/21 |
| 58-139471 | 8/1983 | Japan . |
| 62-104172 | 5/1987 | Japan . |
| 63-46777 | 2/1988 | Japan .............. 437/21 |
| 1543132 | 3/1979 | United Kingdom . |
| 2140617 | 11/1984 | United Kingdom ... 437/21 |

Primary Examiner—Mary Wilczewski
Attorney, Agent, or Firm—Armstrong, Westerman, Hattori, McLeland & Naughton

[57] ABSTRACT

A metal-oxide-semiconductor device having a semiconductor-on-insulator structure comprises an insulator substrate; a single crystal semiconductor substrate provided on the insulator substrate, the single crystal semiconductor substrate and the insulator substrate forming a part of the semiconductor-on-insulator structure; source and drain regions doped to a first conduction type and defined in the single crystal semiconductor substrate; a channel region defined in the single crystal semiconductor substrate so as to be interposed between the source and drain regions, the channel region being doped to a second conduction type opposite to the first conduction type with a first impurity concentration level; a gate insulator film provided on the single crystal semiconductor substrate in correspondence to the channel region; and a gate electrode provided on the gate insulator film in correspondence to the channel region with a predetermined gate length; wherein the channel region is defined by a back channel elimination region having an increased impurity concentration level exceeding the first impurity concentration level such that the back channel elimination region is located adjacent to the insulator substrate for eliminating the back channel effect, the back channel elimination region being provided under the gate electrode in a manner such that the back channel elimination region is separated from the source and the drain regions by a region having a smaller impurity concentration level.

3 Claims, 4 Drawing Sheets

METHOD OF FABRICATING A METAL-OXIDE-SEMICONDUCTOR DEVICE HAVING A SEMICONDUCTOR ON INSULATOR (SOI) STRUCTURE

This is a division of application Ser. No. 781,651, filed Oct. 25, 1991, now abandoned, which is a continuation of application Ser. No. 525,015, filed May 18, 1990, now abandoned.

BACKGROUND OF THE INVENTION

The present invention generally relates to metal-oxide-semiconductor (MOS) devices and more particularly to a MOS device having the semiconductor-on-insulator (SOI) structure wherein the back channel effect is eliminated.

In conventional MOS transistors, the increase of operational speed of the device is limited because of the parasitic capacitance formed between the source/drain region and the substrate. In a MOS transistor having the SOI structure wherein a thin semiconductor layer acting as the substrate is provided on an insulator layer, such a parasitic capacitance is decreased significantly and a high speed operation can be achieved. Such a device also has a preferable feature of near-ideal isolation between the semiconductor devices and associated therewith, the device generally has a high breakdown voltage.

FIG. 1 shows a typical structure of the MOS transistor formed on an SOI substrate. Referring to the drawing, the SOI substrate includes a silicon wafer 40 and a silicon oxide layer 41 provided thereon. On the silicon oxide layer 41, there is formed a usual MOS transistor having a single crystal silicon substrate layer 42, source and drain regions 46 formed in the layer 42, a channel region 44 intervening between the source and drain regions 46, and a gate electrode 45 provided on the layer 42. The substrate layer 42 is isolated from the substrate layer of adjacent transistors by an isolation region 43 of silicon oxide. In the drawing, illustration of the gate insulation film is omitted.

Although such a structure is effective in reducing the parasitic capacitance, there arises a problem that a so-called back channel effect is tend to be caused. In the back channel effect, electric charges are accumulated at the interface between silicon substrate layer 42 and the silicon oxide layer 41 underneath, and such electric charges provide a back channel extending across the source and drain regions along the interface. In response to the appearance of the back channel effect, a leak current flows across the source and drain regions as illustrated by the arrow in FIG. 1.

As the back channel is an conductive inversion layer formed by the electric charges in the insulator layer 41, and the formation of the back channel can be reduced when the impurity concentration is increased. In other words, the back channel effect can be suppressed by increasing the impurity concentration of the semiconductor layer 42 acting as the substrate of the MOS transistor. For example, Japanese Laid-open Patent Application No. 58-64064 discloses a MOS transistor having the SOI structure wherein the semiconductor layer providing the channel region between the source and the drain regions is doped by ion implantation of impurities such that the concentration level of the impurities therein changes with three distinct concentration levels with the depth of the semiconductor layer. In this prior art, the concentration level adjacent to the insulator layer is maximized for eliminating the back channel effect.

Alternately, there is disclosed a similar technique for eliminating the back channel effect in the Japanese Laid-open Patent Application 60-220425. FIG. 2 shows the general feature of the MOS transistor disclosed in these prior art references. In such a MOS transistor, the channel region 44 is divided into the normal channel region 44a having a normal impurity concentration level and a back channel effect eliminating region 47 doped to an increased impurity concentration level. This region 47 is formed adjacent to the silicon oxide layer 41. Similarly to FIG. 1, the region 46 represents the source and drain regions and the region 45 represents the gate electrode.

In the MOS transistor of FIG. 2, the back channel effect is successfully eliminated as a result of the provision of the region 47. However, such a structure has a problem of poor breakdown characteristic because of the reason that the region 47 which is doped for example to the p-type with the high concentration level is located in contact with the source or drain region 46 which is doped to the n-type with the high concentration level. More specifically, such a device shows a decrease of the breakdown voltage to less than 10 volts when the region 47 is doped to the level of $2 \times 10^{17}$ $cm^{-3}$. In the usual device wherein the region 47 is not provided and the channel region 44 is doped in the level of $1 \times 10^{16}$ $cm^{-3}$, on the other hand, the breakdown voltage is usually about 50 volts.

Generally, the MOS integrated circuits are required to have a breakdown voltage which is about two times as large as the supply voltage in consideration of the noise in the supply voltage and the substrate biasing. As the supply voltage is usually set to 5 volts, the breakdown voltage of 10 volts or less is apparently insufficient.

Further, there is a known MOS transistor disclosed in the Japanese Laid-open Patent Application No. 62-104172 having an offset gate structure. The MOS transistor is constructed on a silicon single crystal layer provided on a silicon oxide substrate and has an isolated doped region having an increased impurity concentration level in the channel region formed in the silicon single crystal layer in correspondence to a boundary between the silicon oxide substrate and the silicon single crystal layer for eliminating the back channel effect. This isolated doped region is provided under an overhanging drain region characterizing the offset gate structure but is separated therefrom and further in an offset relationship with respect to the gate electrode provided on the silicon single crystal layer. Although this prior art MOS transistor can eliminate the back channel effect by the isolated doped region interrupting the formation of the inversion layer extending between the source and drain regions along the boundary to the underlying silicon oxide substrate, it has a problem in that a neutral region is formed in the channel region because of the relatively large thickness of the channel layer (about 0.5 μm) which prevents the depletion region formed during the operation of the transistor from extending to and reaching the boundary to the underlying silicon oxide layer. When this occurs, there is a possibility that holes, which may be formed during the operation of the transistor as a result of impact ionization, are accumulated in the neutral region. In response thereto, the silicon single crystal layer is biased with respect to the source region and there appears a parasitic bipolar action in the parasitic bipolar transistor formed by the source region, drain region and the channel region intervening therebetween. When such a parasitic bipolar action occurs, a large amount of carriers are caused to flow between the source and drain regions and the breakdown voltage between the source and drain regions is significantly decreased. The MOS transistor of this reference is also disadvantageous from the viewpoint of forming a parasitic capacitance under the overhanging drain region which reduces the operational speed of the transistor. Further, such a MOS transistor having the offset gate structure occupies a large area and is disadvantageous from the view point of increasing the integration density of the integrated circuit. Furthermore, the resistance caused by the overhanging drain region provides an effect of reducing the operational speed.

SUMMARY OF THE INVENTION

Accordingly, it is a general object of the present invention to provide a novel and useful MOS transistor and a fabrication method thereof, wherein the foregoing problems are eliminated.

Another object of the present invention is to provide a metal-oxide-semiconductor device having a semiconductor-on-insulator structure, comprising: an insulator substrate; a single crystal semiconductor substrate provided on the insulator substrate, the single crystal semiconductor substrate and the insulator substrate forming a part of the semiconductor-on-insulator structure; source and drain regions doped to a first conduction type and defined in the single crystal semiconductor substrate; a channel region defined in the single crystal semiconductor substrate so as to be interposed between the source and drain regions, the channel region being doped to a second conduction type opposite to the first conduction type with a first impurity concentration level; a gate insulator film provided on the single crystal semiconductor substrate in correspondence to the channel region; and a gate electrode provided on the gate insulator film in correspondence to the channel region with a predetermined gate length; wherein the channel region is defined by a back channel elimination region having an increased impurity concentration level exceeding the first impurity concentration level such that the back channel elimination region is located adjacent to the insulator substrate for eliminating the back channel effect taking place therethrough, the back channel elimination region being provided under the gate electrode in a manner such that the back channel elimination region is separated from the source and the drain regions by a region having an impurity concentration level smaller than the increased impurity concentration level. According to the present invention, the back channel effect is successfully eliminated by the use of the region of increased impurity concentration while maintaining a satisfactory break down voltage as a result of forming the region so as to be separated from the source and drain regions of the MOS transistor.

Other objects and further features of the present invention will become apparent from the following detailed description when read in conjunction with attached drawings.

DETAILED DESCRIPTION

Hereinafter, a first embodiment of the MOS transistor according to the present invention will be described together with the fabrication steps thereof with reference to FIG. 3 and FIGS. 4A–4E.

Figure 4A:
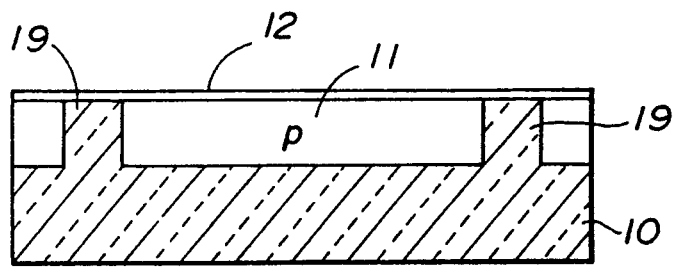
FIGS. 4A–4E are diagrams showing various steps of fabricating the MOS transistor of FIG. 3.

Referring to FIG. 4A at first, an SOI semiconductor body including a silicon oxide substrate 10 and a p-type single crystal silicon layer 11 is subjected to a thermal oxidation process wherein a silicon oxide film 12 having a thickness of about 200 Å is formed on the silicon layer 11. It should be noted that the single crystal silicon layer 11 are divided into a number of portions which are separated from each other by a silicon oxide isolation region 19. The SOI semiconductor body may be formed by binding a pair of semiconductor wafers each having an oxidized surface such that the oxidized surfaces are contacted each other. Alternatively, the SOI semiconductor body may be formed by the so-called SIMOX process wherein oxygen ions are selectively implanted to a semiconductor wafer in correspondence to the depth of the silicon substrate. In any case, the p-type silicon layer 11 has a thickness of about 0.1 $\mu$m and a specific resistance of about 10 $\Omega$cm. In order to maintain a sufficient mechanical strength, it is usual that the SOI semiconductor body is used in a state that it is supported by a silicon wafer.

The silicon oxide film 12 is formed on the p-type silicon layer 11 in order to prevent the contamination of the silicon layer 11 from the photoresist applied in the subsequent process and at the same time for preventing the occurrence of the channeling in response to the ion implantation. Further, the silicon oxide film 12 acts to remove the impurities from the silicon layer 11 and protects the surface of the silicon layer 11.

Figure 4B:
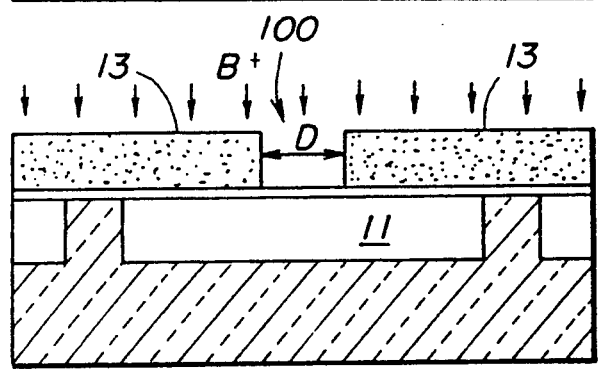

Next, in a step of FIG. 4B, a photoresist 13 is applied on the top surface of the silicon oxide film 12 and a part thereof having a size D is removed photolithographically as a window in correspondence to the gate electrode to be formed in the later process. The size D is chosen to be 0.5 $\mu$m as will be described.

Figure 4C:
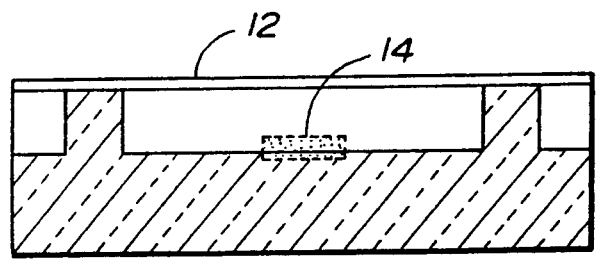

Next, using the photoresist thus patterned as the mask, an ion implantation of boron ($B^+$) is performed under an acceleration voltage of 30–40 keV with a dose of $3 \times 10^{-}$cm$^{-2}$. Upon the ion implantation, the boron ions are implanted into the silicon layer 11 in correspondence to the removed part of the photoresist. Most of the boron ions thus implanted reach the depth close to the boundary between the silicon layer 11 and the silicon oxide layer 10 underneath as shown in FIG. 4C.

Figure 4D:
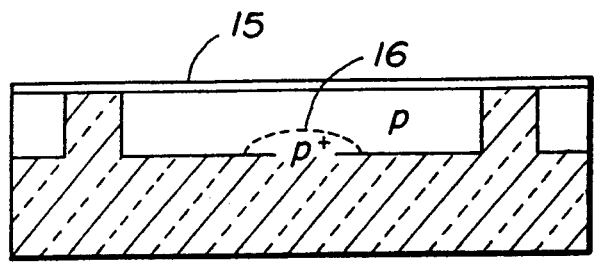

Next, the photoresist 13 is removed and the silicon oxide film 12 is removed also subsequently. Next, the substrate thus obtained is subjected to a thermal oxidation under hydrochloride vapor at a temperature between 900°–950° C. Thereby, a gate insulation film 15 is formed on the surface of the silicon layer 11. At the same time to the process of oxidation, the implanted boron ions are activated and a $p^+$-type region 16 of increased impurity concentration level is formed as illustrated in FIG. 4D. In FIG. 4D, the dotted boundary of the region 16 shows the concentration profile of boron which is reduced by a factor of about two orders of magnitude ($10^2$) with respect to the maximum concentration of boron in the region 16.

Figure 4E:
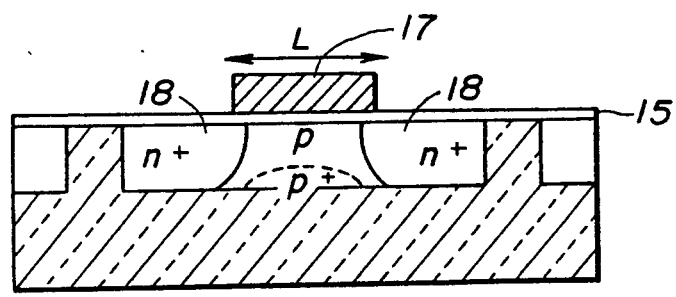

Next, a gate electrode 17 of polysilicon is deposited on the gate insulator film 15 by a CVD process and patterned subsequently such that the gate electrode 17 remains above the region 16 for a gate length L of 0.8 $\mu$m as shown in FIG. 4E. This gate electrode 17 may be a lamination of polysilicon and silicide. The alignment between the patterned gate electrode 17 and the region 16 located below the gate electrode 17 can be achieved with an alignment accuracy within about 0.03 $\mu$m using the same stepper.

Figure 1:
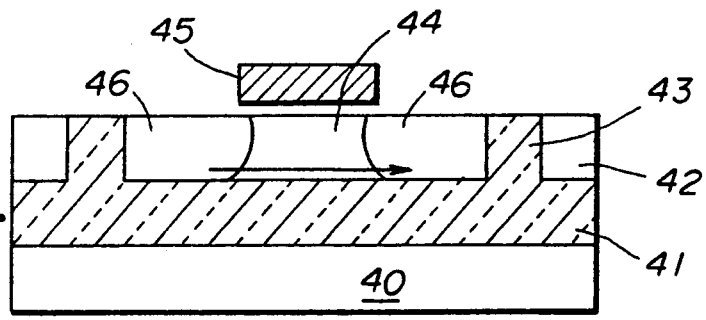
FIG. 1 is a cross-sectional view showing a prior art MOS transistor having an SOI structure.
Figure 2:
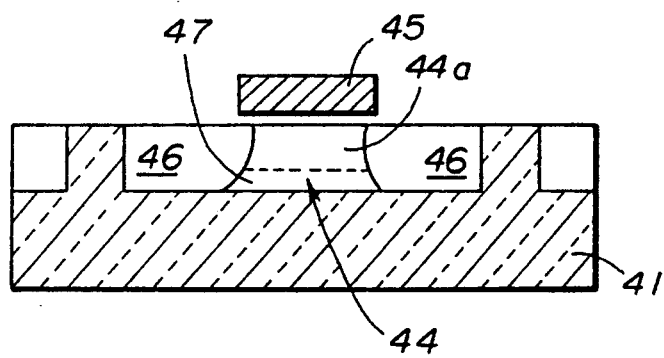
FIG. 2 is a cross-sectional view showing another prior art MOS transistor having a structure for eliminating the back channel effect.
Figure 3:
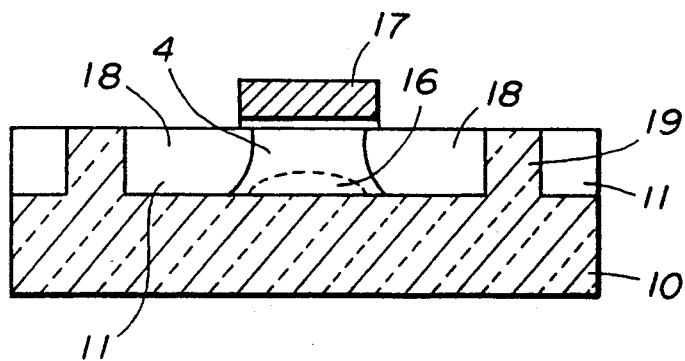
FIG. 3 is a cross-sectional view showing a first embodiment of the present invention.

Next, using the gate electrode 17 as the mask, ion implantation of arsenic (As+) is made under an acceleration voltage of 60 keV for a dose of $5 \times 10^{15}$ cm$^{-2}$, and after a subsequent annealing, source and drain regions 18 are formed in the semiconductor layer 11. Further, by removing the silicon oxide film 15 from a region covering the source and drain regions 18, a MOS transistor shown in FIG. 3 is completed wherein the source and drain regions 18 as well as a channel region 4 intervening therebetween are provided in the substrate 11 which in turn is provided on the insulator layer 10. As can be seen, the gate electrode extends between the source and drain regions 18 in a manner to cover a part of the source and drain regions 18 while the region 16 is provided immediately under the gate electrode 17 with a separation from the source and drain regions 18. This transistor is isolated from adjacent transistors by the isolation region 19 of silicon oxide which is formed already at the beginning of the process of FIG. 4A.

In the foregoing process, the size D of the window formed in the photoresist 13 is chosen such that the size D is smaller than the gate length L by 0.2–0.3 $\mu$m or more. As already described, the size D is set to 0.5 $\mu$m and the gate length L is set to 0.8 $\mu$m in the foregoing embodiment. By choosing the size D of the window as such, the region 16 remains invariably smaller than the gate electrode 17.

According to the foregoing construction, the formation of unwanted p-n junction between the region 16 and the source or drain region 18, which otherwise would cause the decrease of the breakdown voltage, is eliminated because of the region 16 having a size smaller than the separation between the source and drain regions 18. Even when the diffusion of implanted boron ions may occur as a result of the accompanying annealing such that the tail of the compositional profile defining the region 16 is contacted with the source or drain region 18, the concentration of boron in such a contacting region can be held small and does not cause any substantial decrease of the breakdown voltage. Thus, the present invention can successfully eliminate the back channel effect while without causing the decrease of the breakdown voltage.

Next, a second embodiment of the present invention will be described with reference to FIGS. 5A–5E. In the drawings, the parts corresponding to the parts already described with reference to preceding drawings are given identical reference numerals and the description thereof will be omitted.

Figure 5A:
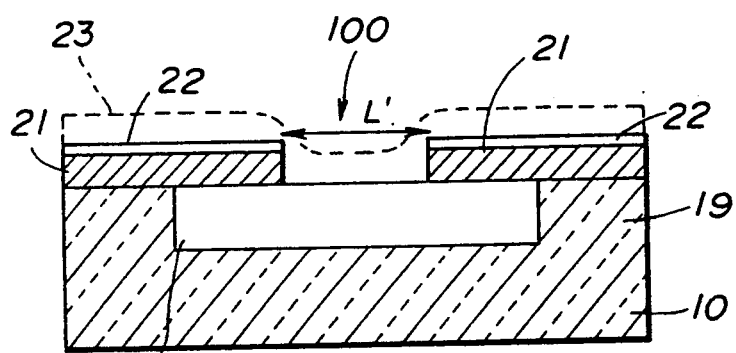
FIGS. 5A–5E are diagrams showing another process of fabricating a MOS transistor having the SOI structure wherein the back channel effect is eliminated.

Referring to FIG. 5A at first, a polysilicon layer 21 is deposited on the silicon layer 11 including the isolation region 19 for a thickness of 2,000–3,000 Å by a CVD process. Next, the polysilicon layer 21 is doped with phosphorus (P) with a concentration determined such that the layer 21 has a surface resistivity of about 20 $\Omega/\square$. This layer 21 is used later as the source and drain regions of the MOS transistor. This layer 21 may be formed as a laminated structure of polysilicon and silicide. The doping may be made by ion implantation under an acceleration voltage of 50 keV, and a does of $5 \times 10^{15}$ cm$^{-2}$ is used when phosphorus ions are doped. In the case of doping the polysilicon layer 21 by arsenic, the acceleration voltage is changed to 60 keV.

Next, a silicon oxide film 22 is deposited on the layer 21 by a low temperature CVD process at a temperature of 400° C. for a thickness of 200 Å, and a part of the polysilicon layer 21 and the silicon oxide film 22 corresponding to the gate of the MOS transistor to be formed is removed by etching for a size L' to form an window 100. This size L' corresponds to the gate length of the desired MOS transistor.

Figure 5B:
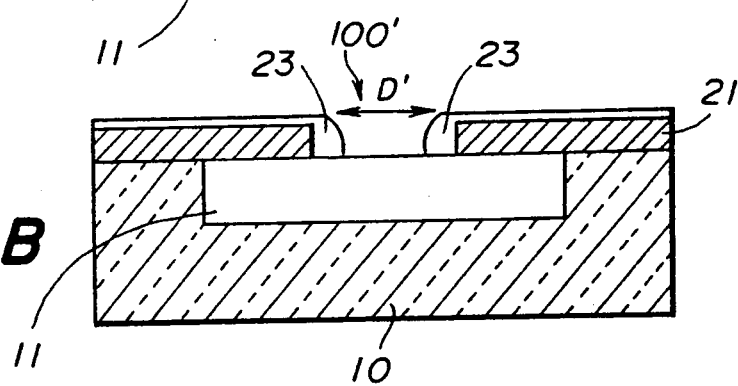

Further, a silicon oxide layer 23 shown in FIG. 5A by a broken line is deposited on the structure by a low temperature CVD process for 2,000 Å and the layer 23 is subsequently subjected to anisotropic etching process proceeding vertically to the surface of the layer 22 until the top surface of the substrate 11 is exposed in correspondence to the window L'. This anisotropic etching process may be performed by the reactive ion etching (RIE) process. Thereby, the oxide layer 23 is remained at the side wall of the window 100 substantially unetched, and there is formed a window 100' having a reduced size D' as shown in FIG. 5B. By the foregoing process, the size D' of the window 100' is smaller than the size L' of the window 100 by 0.3–0.4 $\mu$m.

Figure 5C:
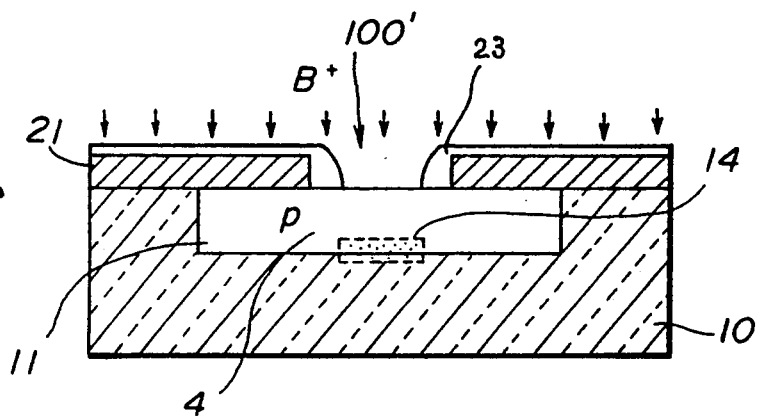

Next, the structure of FIG. 5B is subjected to ion implantation of B+ under an acceleration voltage of 30–40 keV with a dose of $3 \times 10^{13}$cm$^{-2}$. In this ion implantation, the polysilicon layer 23 remaining at the side wall of the window 100' acts as the mask and the ion implantation is made only in correspondence to the window 100' having the size D' as shown in FIG. 5C. It should be noted that the implanted boron ions reach a depth corresponding to the boundary between the single crystal silicon layer 11 and the insulator layer 10 underneath as illustrated therein. BF$_2$ may also be used as the ions to be implanted.

Figure 5D:
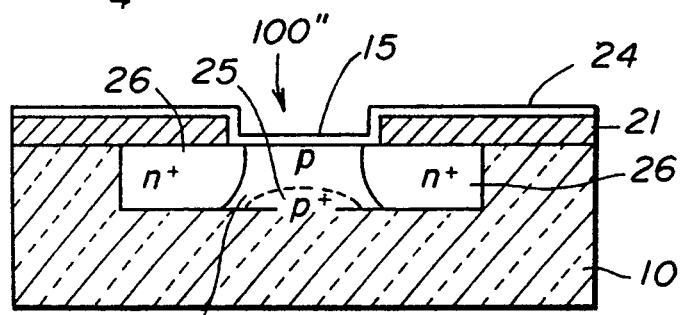
Figure 5E:
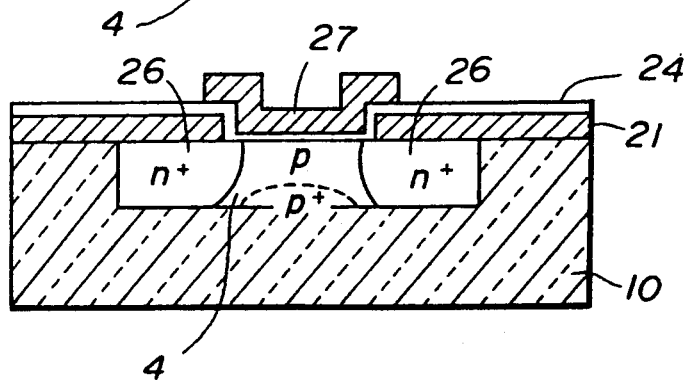

Next, a silicon oxide film 23 remaining in the structure of FIG. 5C is removed completely, and a new silicon oxide film 24 is formed as shown in FIG. 5D by thermal oxidation at 900°–950° C. under the existence of hydrochloride. This silicon oxide film 24 has a thickness of 200 Å for example and acts as the gate insulator film. It should be noted that during this thermal oxidation process, the oxidation proceeds more rapidly in the surface of the polysilicon layer 21 than in the surface of the single crystal silicon layer 11. Thus, the thickness of the silicon oxide layer 24 has a thickness of 400–500 Å at the side wall of the window which now has an increased size as illustrated by a reference numeral 100'' as well as on the top surface of the layer 21, and because of this, a sufficient breakdown voltage is secured between the gate electrode and the polysilicon layer.

At the time of the heat treatment associated with the formation of the gate insulator film 24, the implanted boron ions are activated, and a p+ region 25 is formed. This p+ region 25 corresponds to the region 16 of the MOS transistor of the first embodiment, and acts as a layer for eliminating the back channel effect. The dotted boundary of the region 25 represents the concentration profile of B+ which is decreased by a factor of $10^2$ similarly to the case of the region 16. Further, P+ ions incorporated into the polysilicon layer 21 by the ion implantation are diffused into the single crystal silicon layer 11 at the time of foregoing thermal oxidation, and thereby source and drain regions 26 of the n+-type are formed in the layer 11. FIG. 5D shows the semiconductor device after the foregoing processes.

Next, a gate electrode 27 is provided in correspondence to the window 100". It should be noted that the window 100" has the size which is substantially identical to the size L' of the window 100, as the window 100" is smaller than the window 100 only by the thickness of the silicon oxide layer 24 which is, as already described, only about 400–500 Å. Thus, the MOS transistor thus formed has the gate length which is substantially identical to the size L'. After the deposition of the gate electrode 27, the silicon oxide layer 24 covering the polysilicon layer 21 is removed and the fabrication of the MOS transistor is completed.

It should be noted that, in this transistor, too, the region 25 for eliminating the back channel effect is separated from the source and drain regions 26. In other words, the p+-type region 25 does not form the p-n junction with the source or drain region 26 directly, and thereby the problem of unwanted decrease of the drain breakdown voltage is successfully eliminated.

Further, the present invention is not limited to these embodiments described heretofore but various variations and modifications may be made without departing from the scope of the invention.

What is claimed is:

1. A method for fabricating a metal-oxide-semiconductor device having a semiconductor-on-insulator structure, said semiconductor-on-insulator structure including an insulator substrate and a single crystal semiconductor substrate formed thereon, said single crystal semiconductor substrate being doped by first impurities to a first conduction type so as to provide a channel region therein, said method comprising steps of:

providing a polycrystal semiconductor layer doped by second impurities to a second conduction type opposite to the first conduction type on a surface of the single crystal semiconductor substrate as an electrode layer of the metal-oxide-semiconductor device;

forming an opening having a first size in the polycrystal semiconductor layer such that a top surface of the single crystal semiconductor substrate is exposed, said opening being laterally defined by a side wall;

carrying out an ion implantation process for introducing third impurities through the opening using a mask such that impurities are concentrated in an isolated region located in a vicinity of an interface between the single crystal semiconductor substrate and the insulator substrate, said isolated region having a second size smaller than the first size;

applying a thermal oxidation process such that a gate insulator film is formed on the exposed top surface of the single crystal semiconductor substrate and on the side wall of the opening, said thermal oxidation process causing a diffusion of the second impurities from the polycrystal semiconductor layer into the single crystal semiconductor substrate for thereby forming source and drain regions in the single crystal semiconductor substrate, said thermal oxidation process further causing an activation of the third impurities in the isolated region; and providing a gate electrode in correspondence to the opening such that the gate electrode has a gate length larger than the second size.

2. A method as claimed in claim 1 in which said mask is formed by a step of providing a first insulator layer on the polycrystal semiconductor layer, the step of forming the opening through the first insulator layer and the polycrystal semiconductor layer, a step of depositing a second insulator layer on the first insulator layer including the opening and the side wall such that the exposed top surface of the single crystal semiconductor substrate and the side wall of the opening are covered by the second insulator layer, and a step of removing the second insulator layer by an anisotropic etching process proceeding vertically to a major plane of the second insulator layer until the top surface of the single crystal semiconductor substrate is exposed wherein said anisotropic etching process being performed such that the second insulator layer is remained at the side wall of the opening.

3. A method as claimed in claim 1 in which said first impurities and said third impurities are identical.

* * * * *